(12) United States Patent
Kong et al.

(10) Patent No.: US 12,262,472 B2
(45) Date of Patent: Mar. 25, 2025

(54) POWER MODULE

(71) Applicants: Hyundai Motor Company, Seoul (KR); Kia Corporation, Seoul (KR)

(72) Inventors: Nam Sik Kong, Gyeonggi-do (KR); Jun Hee Park, Gyeonggi-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 232 days.

(21) Appl. No.: 17/974,266

(22) Filed: Oct. 26, 2022

(65) Prior Publication Data
US 2023/0397336 A1   Dec. 7, 2023

(30) Foreign Application Priority Data

Jun. 7, 2022   (KR) ................... 10-2022-0069075

(51) Int. Cl.
*H05K 1/14* (2006.01)
*H05K 1/02* (2006.01)

(52) U.S. Cl.
CPC ........... *H05K 1/145* (2013.01); *H05K 1/0203* (2013.01); *H05K 2201/09036* (2013.01)

(58) Field of Classification Search
CPC ....... H01L 23/3735; H01L 2224/33181; H01L 2924/014; H01L 2224/83801; H01L 23/5385; H01L 23/49833; H01L 2224/26175; H01L 2224/83815; H05K 1/0204; H05K 3/107; H05K 3/3468; H05K 1/0203; H05K 2201/09036
USPC ........................................................ 361/688
See application file for complete search history.

(56) References Cited

U.S. PATENT DOCUMENTS

| | | | |
|---|---|---|---|
| 6,750,084 B2 * | 6/2004 | Delheimer | H05K 1/0206 257/E23.06 |
| 6,933,173 B2 * | 8/2005 | Yunus | H01L 24/97 257/E21.503 |
| 7,615,873 B2 | 11/2009 | Steers et al. | |
| 2018/0174945 A1 * | 6/2018 | Park | H01L 25/072 |
| 2021/0265235 A1 * | 8/2021 | Park | H05K 7/209 |
| 2023/0397384 A1 * | 12/2023 | Park | H01L 23/4334 |

FOREIGN PATENT DOCUMENTS

| | | | |
|---|---|---|---|
| CN | 206388700 U | * | 8/2017 |
| JP | 2001-257444 A | | 9/2001 |
| KR | 10-2003-0024620 A | | 3/2003 |
| KR | 10-2009-0080605 A | | 7/2009 |
| KR | 10-2009-0108777 A | | 10/2009 |
| KR | 10-2012-0017602 A | | 2/2012 |
| KR | 10-2018-0052143 A | | 5/2018 |
| KR | 10-2019-0043444 A | | 4/2019 |
| KR | 10-2021-0086935 A | | 7/2021 |

OTHER PUBLICATIONS

English tranlsation 2018.*

* cited by examiner

*Primary Examiner* — Mandeep S Buttar
(74) *Attorney, Agent, or Firm* — Fox Rothschild LLP

(57) ABSTRACT

Provided is a power module capable of preventing an overflow situation of solder and a movement of the solder when a chip and a spacer are bonded to each substrate by a soldering process, thereby being capable of increasing bonding quality between components through the soldering process.

16 Claims, 7 Drawing Sheets

POWER MODULE

CROSS REFERENCE TO RELATED APPLICATION

The present application claims under 35 U.S.C. § 119(a) the benefit of Korean Patent Application No. 10-2022-0069075, filed Jun. 7, 2022, the entire contents of which are incorporated herein for all purposes by this reference.

BACKGROUND

Field of the Disclosure

Embodiments of the present disclosure relate to a power module. More particularly, the present disclosure relates to a power module capable of preventing an overflow situation of solder and a movement of the solder when a semiconductor chip and a spacer are bonded to each substrate by a soldering process, thereby being capable of increasing bonding quality between components through the soldering process.

Background

As one of the core parts of a hybrid vehicle and an electric vehicle, a power converter (e.g., an inverter) is the main component of an eco-friendly vehicle, and many technologies for the power converter have been developed. Further, developing a power module which is the core component of the power converter and which costs the most is a key technology in the field of eco-friendly vehicles.

In order to realize a circuit configuration of a double-sided cooling power module, the double-sided cooling power module requires an electrical connection between an upper substrate and a lower substrate. At this time, a spacer serves to electrically connect the upper substrate to the lower substrate. In addition, the spacer mainly serves to perform electrical connection rather than heat dissipation, and is generally used in the power module.

Such a spacer and a chip are connected to each substrate through a soldering process. However, during the soldering process, when an overflow of solder in a vertical direction occurs, there is a problem that an electrical short circuit defect occurs between the substrate and the spacer or between the chip and the spacer, or there is a problem that an insulating layer forming the substrate is exposed by etching.

In addition, when the power module is under a high temperature operating condition or a severe condition, a thermal stress is concentrated mainly on a portion where the insulating layer is exposed, so that there is a risk of destruction of the insulating layer of the substrate.

The foregoing is intended merely to aid in the understanding of the background of the present disclosure, and is not intended to mean that the present disclosure falls within the purview of the related art that is already known to those skilled in the art.

SUMMARY OF THE DISCLOSURE

Accordingly, the present disclosure has been made keeping in mind the above problems occurring in the related art, and an objective of the present disclosure is to provide a power module capable of preventing an overflow situation of solder and a movement of the solder when a semiconductor chip and a spacer are bonded to each substrate by a soldering process, thereby being capable of increasing bonding quality between components through the soldering process.

In order to achieve the above objective, according to one aspect of the present disclosure, there is provided a power module including: a chip; an upper substrate and a lower substrate which are respectively disposed above and below the chip; and a guide groove portion formed of a plurality of grooves which is recessively formed in the upper substrate and the lower substrate around a connection portion of the chip, the guide groove portion being configured to guide molten solder when the chip is bonded to the upper substrate and the lower substrate by a soldering process.

In addition, the plurality of grooves of the guide groove portion may be spaced apart from each other by a predetermined distance such that a separation distance of the plurality of grooves is equal to or more than a minimum separation distance.

In addition, the guide groove portion may be formed such that the plurality of grooves is formed around each side of the chip within a maximum formation ratio.

In addition, the guide groove portion may be formed such that each of the plurality of grooves has a diameter equal to or less than a maximum diameter.

In addition, the guide groove portion may be formed such that the plurality of grooves is disposed to be spaced apart from each other so that each vertex and a portion of edges around each vertex of the chip are surrounded.

In addition, as the guide groove portion has the plurality of grooves arranged as one row, an overlapping portion of the guide groove portion may be formed as one row when each guide groove portion of respective chips overlaps since the respective chips different from each other are disposed adjacent to each other.

In addition, the upper substrate and the lower substrate may be each formed of an upper metal layer, a lower metal layer, and an insulator that is interposed between the upper metal layer and the lower metal layer, and the guide groove portion may be formed in the lower metal layer of the upper substrate and in the upper metal layer of the lower substrate as the chip is bonded to the lower metal layer of the upper substrate and to the upper metal layer of the lower substrate.

In addition, the guide groove portion may be formed such that a depth of each of the plurality of grooves is less than a thickness of the upper metal layer or the lower metal layer to which the chip is bonded.

In addition, the guide groove portion may have the plurality of grooves each of which is formed in a circular shape, so that the molten solder is filled in the guide groove portion during the soldering process.

In the power module configured as described above, the overflow situation of the solder and the movement of the solder are prevented when the chip and the spacer are bonded to each substrate by the soldering process, so that bonding quality between components through the soldering process is increased.

In some embodiments, the power module may further comprise a spacer disposed to be spaced apart from the chip. The spacer may be further included in the upper substrate and the substrate. The spacer may be bonded to the upper substrate and the lower substrate by a soldering process.

In some embodiments, the power module may further comprise a lead frame disposed to be spaced apart from the chip. The lead frame may be electrically connected to any one of the upper substrate and the lower substrate.

In some embodiments, the power module may further comprise an upper cooling portion which is in contact with the upper substrate.

In some embodiments, the power module may further comprise a lower cooling portion which is in contact with the lower substrate.

In another embodiment, vehicles are provided that comprise an apparatus as disclosed herein.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE DISCLOSURE

Figure 1:
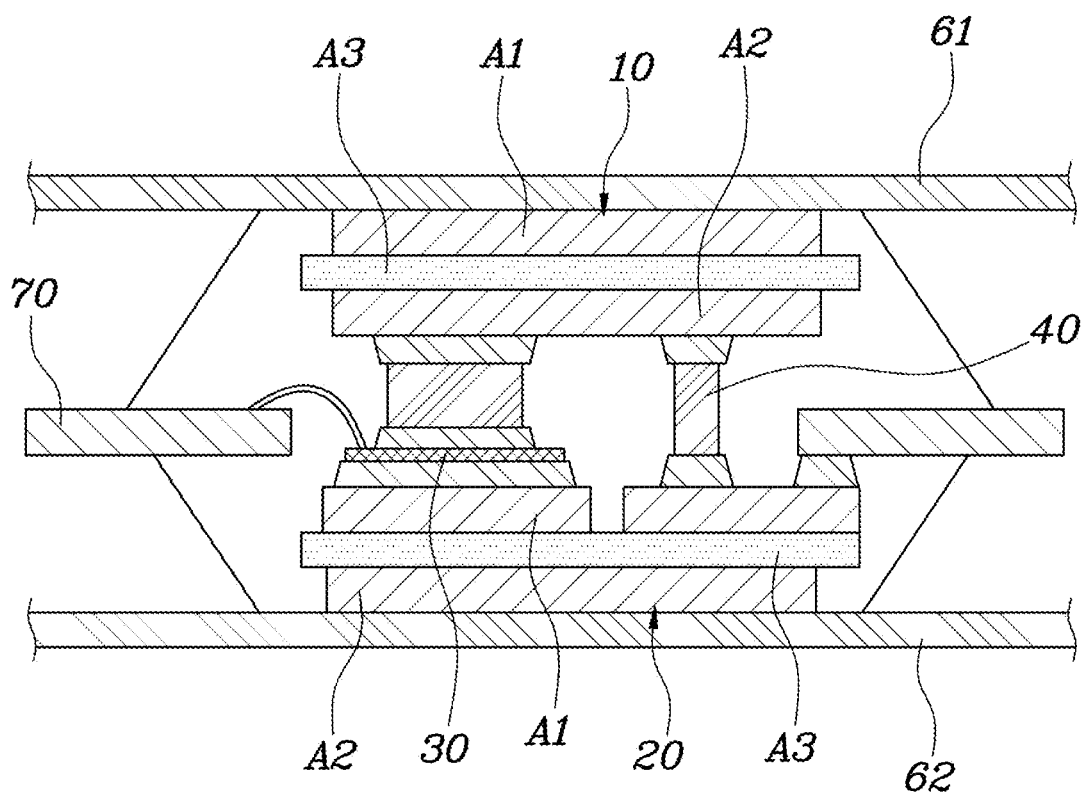
FIG. 1 is a view illustrating a power module according to the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. These terms are merely intended to distinguish one component from another component, and the terms do not limit the nature, sequence or order of the constituent components. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Hereinafter, a power module according to an exemplary embodiment of the present disclosure will be described with reference to accompanying drawings.

Specific structural or functional descriptions of the embodiments of the present disclosure disclosed in the present specification are exemplified only for the purpose of describing the embodiments according to the present disclosure, and the embodiments according to the present disclosure may be implemented in various forms, and should not be construed as being limited to the embodiments described in the present specification.

Since the embodiments according to the present disclosure can be modified in various ways and have various forms, specific embodiments are illustrated in the drawings and will be described in detail in the present specification. However, this is not intended to limit the embodiments according to the concept of the present disclosure to a specific form of disclosure, and it should be understood that all changes, equivalents, and substitutes included in the spirit and scope of the present disclosure are included.

Unless otherwise defined, all terms used herein, including technical or scientific terms, have the same meaning as commonly understood by one of ordinary skill in the art to which the present disclosure belongs. Terms such as those defined in a commonly used dictionary should be interpreted as having a meaning consistent with the meaning of the related technology, and should not be interpreted as an ideal or excessively formal meaning unless explicitly defined in the present specification.

Hereinafter, the present disclosure will be described in detail by describing an exemplary embodiment of the present disclosure with reference to the accompanying drawings. The same reference numerals shown in each drawing indicate the same members.

Figure 2:
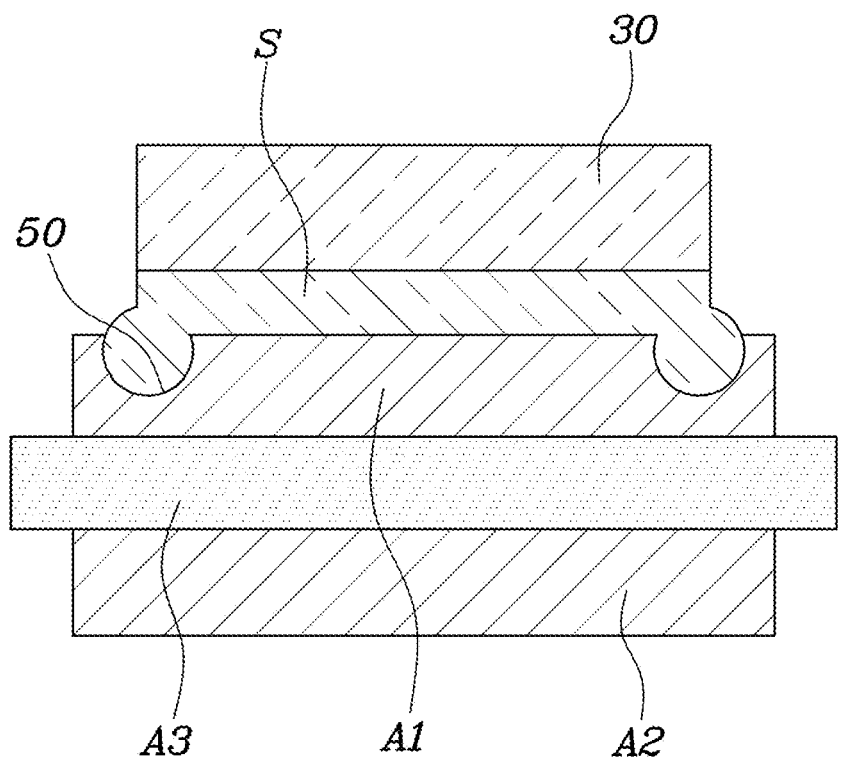
FIG. 2 is a view illustrating a connection of a substrate and components of the power module illustrated in FIG. 1.
Figure 3:
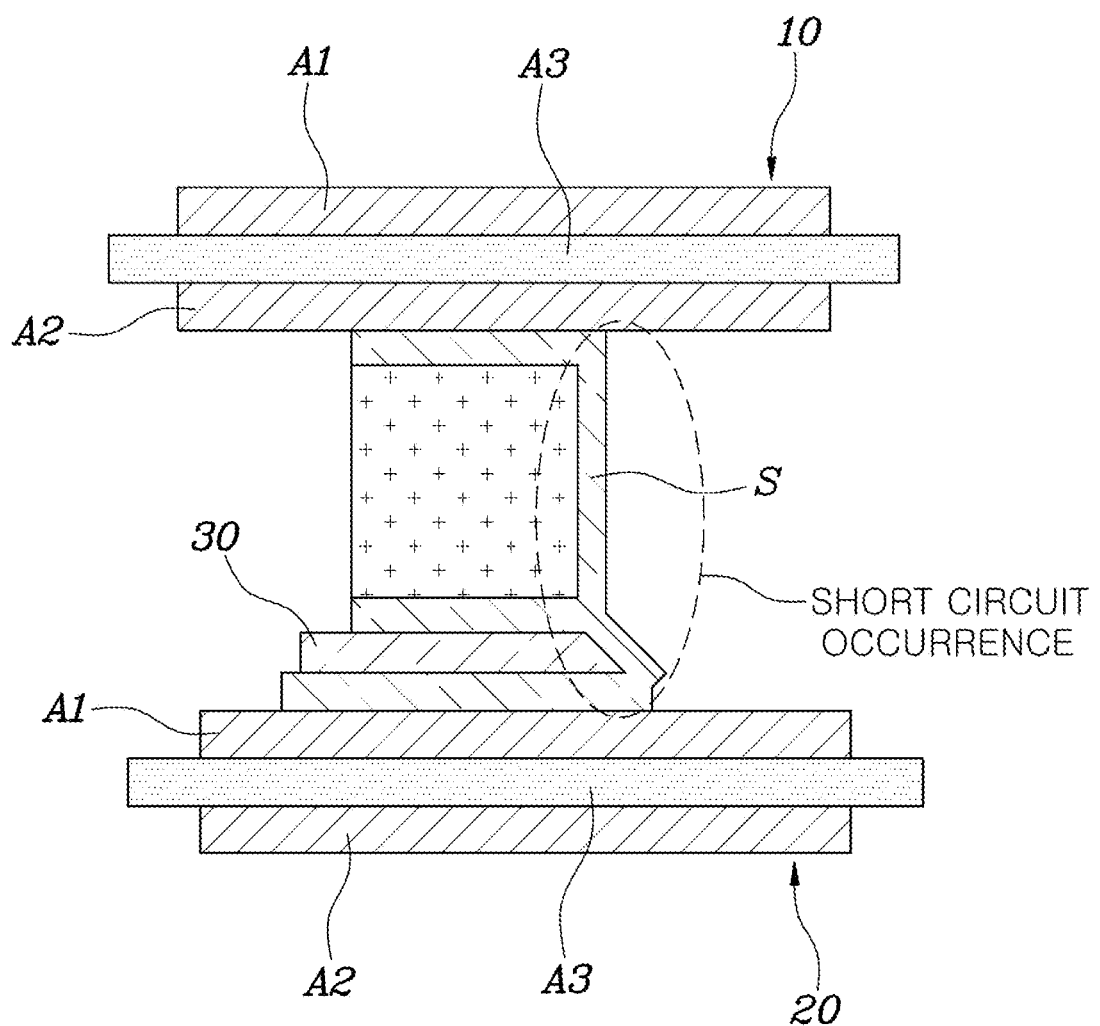
FIG. 3 is a view illustrating a state of the power module illustrated in FIG. 1.

As illustrated in FIGS. 1 to 3, a power module according to the present disclosure may include: a chip 30; an upper substrate 10 and a lower substrate 20 that are respectively disposed above and below the chip 30; and a guide groove portion 50 formed of a plurality of grooves which is recessively formed in the upper substrate 10 and the lower substrate 20 around a connection portion of the chip 30, the guide groove portion 50 being configured to guide molten solder S when the chip 30 is bonded to the upper substrate 10 and the lower substrate 20 by a soldering process.

In addition, a spacer 40 disposed to be spaced apart from the chip 30 may be further included in the upper substrate 10 and the lower substrate 20, and the spacer 40 may also be bonded to the upper substrate 10 and the lower substrate 20 by the soldering process. Accordingly, the guide groove portion 50 may be formed in the upper substrate 10 and the lower substrate 20 on a periphery of the spacer 40.

In addition, the power module according to the present disclosure may further include a lead frame 70 which is disposed to be spaced apart from the chip 30 and which is electrically connected to any one of substrates among the upper substrate 10 and the lower substrate 20. In such a power module, a plurality of chips 30 and a plurality of spacers 40 may be disposed inside one power module, and the lead frame 70 is provided such that an electrical signal is capable of being transmitted to another power module. The lead frame 70 serves to transmit or receive a signal to each substrate of another power module, and is not simultaneously connected to the upper substrate 10 and the lower substrate 20. Further, the lead frame may be connected to the spacer 40 that is disposed between the upper substrate 10 and the lower substrate 20.

The chip 30 may form a circuit by being electrically connected to the upper substrate 10 and the lower substrate 20 that are respectively provided above and below the chip 30. Such a chip 30 may be electrically connected to the upper substrate 10 and the lower substrate 20 via the spacer 40.

Such an upper substrate 10, a lower substrate 20, a chip 30, a spacer 40, and a lead frame 70 may be formed as one structure by molding each configuration thereof. Further, in order to perform a double-sided cooling, an upper cooling portion 61 which is in contact with the upper substrate 10 and which cools the upper substrate 10 by exchanging heat with the upper substrate 10 and a lower cooling portion 62 which is in contact with the lower substrate 20 and which cools the lower substrate 20 by exchanging heat with the lower substrate 20 may be provided.

Particularly, in the present disclosure, since the chip 30 and the spacer 40 are bonded to the upper substrate 10 and the lower substrate 20 by the soldering process, the guide groove portion 50 that guides the molten solder to a periphery of the chip 30 and the spacer 40 may be formed.

Here, the upper substrate 10 and the lower substrate 20 may be each formed of an upper metal layer A1, a lower metal layer A2, and an insulator A3 that is interposed between the upper metal layer A1 and the lower metal layer A2. Further, as the chip 30 and the spacer 40 are bonded to the lower metal layer A2 of the upper substrate 10 and the upper metal layer A1 of the lower substrate 20, the guide groove portion 50 may be formed in the lower metal layer A2 of the upper substrate 10 and in the upper metal layer A1 of the lower substrate 20.

That is, the chip 30 and the spacer 40 according to an embodiment of the present disclosure may be bonded to the upper substrate 10 and the lower substrate 20 by the soldering process. However, due to the characteristics of the soldering process, when an overflow of the molten solder occurs, an electrical short circuit of the chip 30 or the spacer 40 occurs. That is, as illustrated in FIG. 3, when an overflow of the molten solder in a vertical direction occurs, a short circuit may occur between the upper substrate 10 and the lower substrate 20 and the electrical short circuit may occur. Here, the vertical direction may be a direction in which the upper substrate 10 and the lower substrate 20 are facing each other, and a horizontal direction may be a direction orthogonal to the vertical direction.

In addition, as the insulator A3 is exposed from a portion of the lower metal layer A2 of the upper substrate 10 or the upper metal layer A1 of the lower substrate 20, in which the portion is where the soldering process is performed, a thermal stress may be concentrated mainly on a portion exposed under a high temperature operating condition or a severe condition, so that the insulator A3 may be destroyed.

Therefore, by forming the guide groove portion 50 in the upper substrate 10 and the lower substrate 20, the guide groove portion 50 being configured to guide the molten solder to the periphery of the chip 30 and the periphery of the spacer 40, the molten solder may be guided to each groove of the guide groove portion 50 when the soldering process is performed, so that an overflow of the molten solder in the horizontal direction is partially allowed but the overflow of the molten solder in the horizontal direction is restrained. Accordingly, in the upper substrate 10 and the lower substrate 20, the electrical short circuit caused by the overflow of the solder in the vertical direction is prevented.

In describing the present disclosure in detail, the guide groove portion 50 may be formed such that the guide groove portion 50 surrounds each vertex and a portion of edges around each vertex of both the chip 30 and the spacer 40.

As such, as the guide groove portion 50 is formed around each vertex and the portion of the edges around each vertex of both the chip 30 and the spacer 40, the molten solder may be guided to overflow in the horizontal direction during the soldering process. That is, the plurality of grooves forming the guide groove portion 50 is disposed apart from each other such that the plurality of grooves surrounds each vertex and the portion of edges around each vertex of both the chip 30 and the spacer 40. As such, the guide groove portion 50 is formed in a dimple structure that is formed of the plurality of grooves, and the molten solder may be guided to the horizontal direction since the plurality of grooves is disposed to be spaced apart from each other such that each vertex and the portion of the edges around each vertex of both the chip 30 and the spacer 40 are surrounded.

Figure 4:
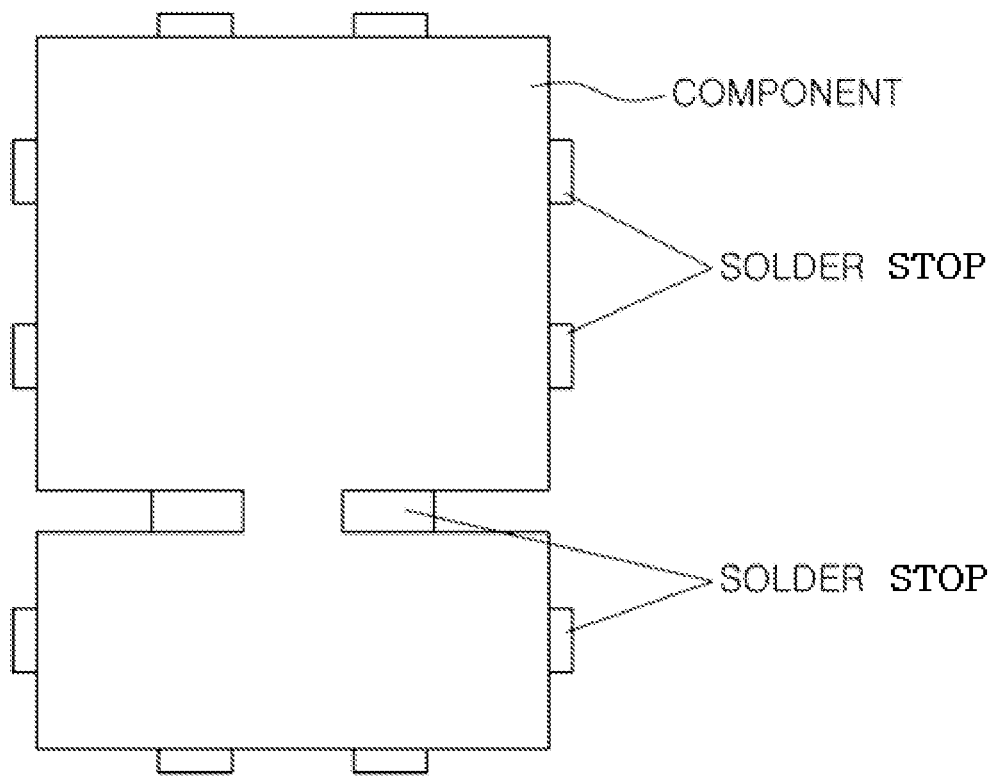
FIG. 4 is a view illustrating an example of a conventional solder stop.
Figure 5:
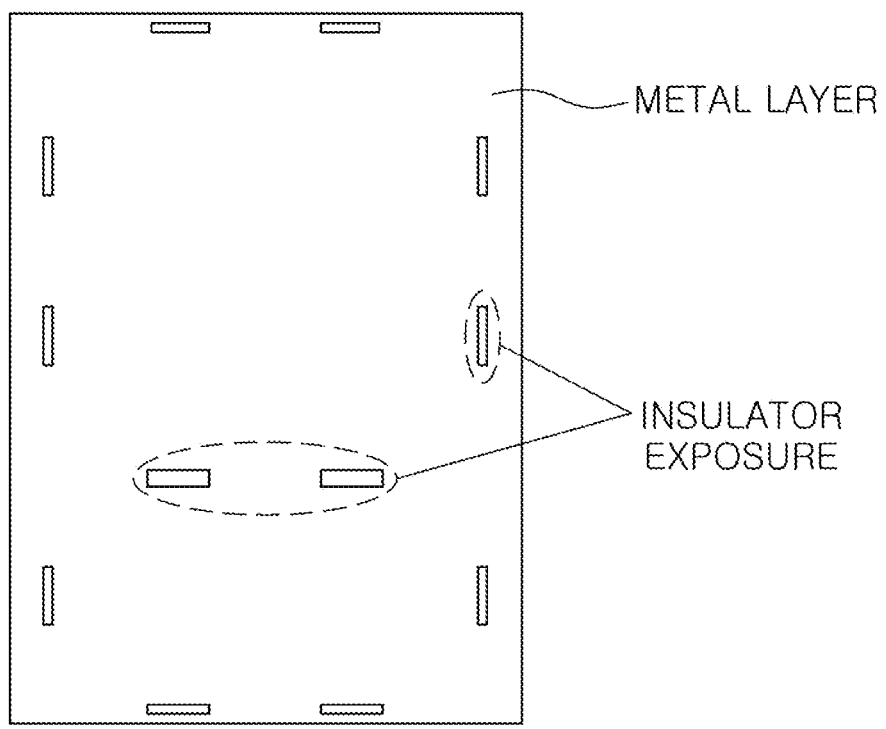
FIG. 5 is a view illustrating an insulator exposed by the conventional solder stop.

That is, conventionally, as illustrated in FIG. 4, a solder stop accommodating molten solder may be formed on a border of a component including a chip and a spacer, so that the solder stop is formed over a wide area. Therefore, conventionally, solder is agglomerated to a small area, so that the overflow of the molten solder in the vertical direction that is a direction facing the drawing occurs, thereby generating the electrical short circuit. In addition, as illustrated in FIG. 5, when the molten solder overflows in the vertical direction, each insulator forming each substrate is exposed, and there is a problem that separation and destruction of each insulator occur due to contraction and expansion of the solder.

Figure 6:
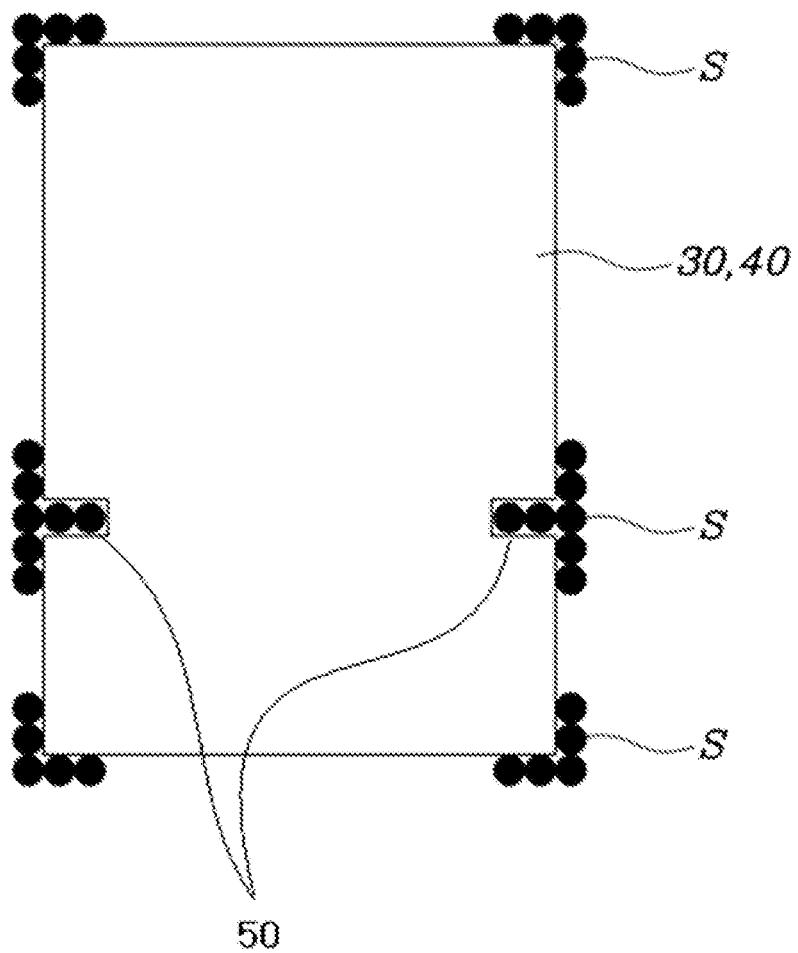
FIG. 6 is a view illustrating an example of a guide groove portion according to the present disclosure.
Figure 7:
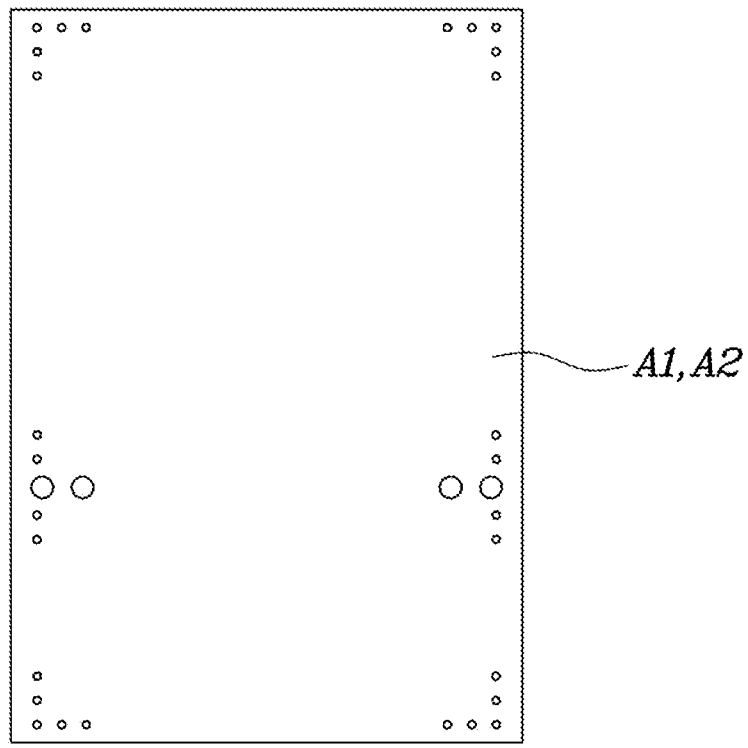
FIG. 7 is a view showing an upper metal layer of the upper substrate or a lower metal layer of the lower substrate in contrast to FIG. 5 in order to explain an effect of the present disclosure.

However, in the present disclosure, as illustrated in FIGS. 6 and 7, since the guide groove portion 50 is formed such that the guide groove portion 50 surrounds each vertex and the portion of the edges around each vertex of both the chip 30 and the spacer 40, the molten solder may be guided to the horizontal direction and overflow with a wide area, so that the overflow of the molten solder in the vertical direction is prevented. As a result, in the present disclosure, since the overflow of the solder in the vertical direction is prevented, exposure of each insulator A3 is minimized, so that the separation and the destruction of each insulator A3 are prevented and a stress relieving effect occurs.

Meanwhile, the guide groove portion 50 may have the plurality of grooves arranged as one row. Therefore, as other chip 30 or other spacer 40 is disposed adjacent to each other, when each guide groove portion 50 of the chip 30 or the spacer 40 is overlapped, the grooves may only be formed as one row on an overlapping portion.

When the plurality of grooves forming the guide groove portion 50 is formed in two or more rows or is excessively formed by including edges except for each vertex of the chip 30 or the spacer 40, the overflow of the solder in the horizontal direction may be restrained and the overflow of the solder in the vertical direction may be guided, so that the electrical short circuit caused by the solder may occur.

In addition, when the number of the plurality of grooves that forms the guide groove portion 50 is too small, such as the plurality of grooves is formed only around a vertex portion of the chip 30 or the spacer 40, the plurality of grooves may not be capable of restricting a movement of the chip 30 or the spacer 40. Therefore, the separation of the solder in the chip 30 or the spacer 40 occurs, so that the stress relieving effect is reduced.

Therefore, in the guide groove portion 50, the plurality of grooves may be arranged as one row, and the grooves of the guide groove portion 50 corresponding to each chip 30 or each spacer 40 may be disposed to be overlapped when other chip 30 or the other spacer 40 are disposed adjacent to the chip 30 or the spacer 40. Further, the plurality of grooves is only formed around a portion of each vertex and the portion of the edges around each vertex of the chip 30 or the spacer 40.

Meanwhile, the guide groove portion 50 may be formed such that a depth of each groove of the guide groove portion 50 is smaller than a thickness of the upper metal layer A1 or the lower metal layer A2 to which the chip 30 or the spacer 40 is bonded.

In each groove that forms the guide groove portion 50, as the depth of each groove increases, more etching process of each metal layer of the upper substrate 10 and the lower substrate 20 may proceed, so that the overflow of the solder in the vertical direction may be guided. Therefore, each groove forming the guide groove portion 50 is formed such that the depth of each groove is smaller than the thickness of the upper metal layer A1 or the thickness of the lower metal layer A2. In addition, by the guide groove portion 50, the solder is prevented from excessively overflowing when the soldering process is performed. For example, when the thickness of the upper metal layer A1 or the thickness of the lower metal layer A2 is 0.3 T, the depth of each groove that forms the guide groove portion 50 may be less than 0.2 T.

Meanwhile, the guide groove portion 50 may be formed such that each groove is spaced apart from each other by a predetermined distance so that a separation distance of each groove is equal to or more than a minimum separation distance. Here, the minimum separation distance may be set to 0.2 mm. That is, in each groove forming the guide groove portion 50, when the separation distance is formed to be too far, the overflow of the solder in the horizontal direction is not guided. Further, when the separation distance is formed to be too close, each groove may interfere with each other, so that the overflow of the solder in the vertical direction may occur.

Therefore, in an embodiment according to the present disclosure, each groove forming the guide groove portion 50 may be set to be spaced apart from each other by 0.2 mm, so that the interference between each groove is avoided, thereby preventing the overflow of the solder in the vertical direction and guiding the overflow of the solder in the horizontal direction.

In addition, the guide groove portion 50 may be formed such that the plurality of grooves is formed in each side of the chip 30 within a maximum formation ratio. The maximum formation ratio may be set to 40%. That is, in an embodiment according to the present disclosure, the guide groove portion 50 is formed only around each vertex and the portion of the edges around each vertex of the chip or the spacer 40. Further, when the plurality of grooves forming the guide groove portion 50 is excessively formed exceeding the maximum formation ratio of 40% in any one side around the chip 30 or the spacer 40, the overflow of the solder in the horizontal direction is restrained and the solder is confined in each groove. Accordingly, the solder generated during the soldering process overflows in the vertical direction along the chip 30 or the spacer 40, so that the electrical short circuit between the upper substrate 10 and the lower substrate 20 occurs by the solder. Therefore, in the guide groove portion 50, by forming the plurality of grooves to be formed around each side of the chip 30 within the maximum formation ratio of 40%, the overflow of the solder in the vertical direction is restrained.

In addition, the guide groove portion 50 may be formed such that a diameter of each groove is set to be equal to or less than a maximum diameter. Here, the maximum diameter may be set to 15 mm. That is, when the diameter of each groove that forms the guide groove portion 50 is excessively large, an exposed portion of the insulator A3 is increased when the guide groove portion 50 is formed in the upper substrate 10 and the lower substrate 20. Therefore, in the guide groove portion 50, the diameter of each groove is limited to be equal to or less than 15 mm so that the exposure of the insulator A3 is minimized, thereby solving a problem of durability occurring according to the high temperature operating condition due to the exposure of the insulator A3 or according to the thermal stress concentrated mainly on the portion where the insulator A3 is exposed under the severe condition.

Meanwhile, the guide groove portion 50 may be formed such that the plurality of grooves is formed in a circular shape so that the solder is filled inside the plurality of grooves during the soldering process. As such, since each groove that forms the guide groove portion 50 is formed in the circular shape, the solder may be stably filled without gaps in each groove. Further, as the solder is filled in the same shape, balancing of the solder that is filled in each groove may be easily realized.

As such, in the present disclosure, the overflow situation of the solder and the movement of the solder may be prevented when the chip 30 and the spacer 40 are bonded to each substrate by the soldering process, so that bonding quality between the components through the soldering process is increased. That is, by controlling the shape, the number, and the position of the guide groove portion 50 that is formed in the upper substrate 10 and the lower substrate 20 around the chip 30 and the spacer 40, when the power module according to the present disclosure is manufactured, the overflow of the solder in the vertical direction is restrained and the electrical short circuit caused by a solder bridge is prevented.

In addition, since the guide groove portion 50 is formed in each vertex on which the thermal stress is concentrated, the stress may be relieved and reliability may be increased. In addition, during the soldering process, the exposure of the insulator A3 is minimized, so that the separation and the destruction of the insulator A3 under a test of high durability or a severe operating condition are restrained.

Accordingly, in the present disclosure, by limiting the position, the distance, the size, and so on of the guide groove portion 50, the area of each metal layer required for a heat dissipation and an electrical connection between the upper substrate 10 and the lower substrate 20 may be secured, so that thermal performance and electrical performance are secured since the loss of the area is minimized.

Although exemplary embodiments of the present disclosure have been described herein, it is understood that the present disclosure should not be limited to these exemplary embodiments and that various changes and modifications can be made by one ordinary skilled in the art within the spirit and scope of the present disclosure.

What is claimed is:

1. A power module comprising:
   a chip;
   an upper substrate and a lower substrate which are respectively disposed above and below the chip; and
   a guide groove portion formed of a plurality of grooves which is recessively formed in the upper substrate and the lower substrate around a connection portion of the chip, the guide groove portion being configured to guide molten solder when the chip is bonded to the upper substrate and the lower substrate by a soldering process, wherein the guide groove portion is formed such that the plurality of grooves is disposed to be spaced apart from each other so that each vertex and a portion of edges around each vertex of the chip are surrounded.

2. The power module of claim 1, wherein the plurality of grooves of the guide groove portion is spaced apart from each other by a predetermined distance such that a separation distance of the plurality of grooves is equal to or more than a minimum separation distance.

3. The power module of claim 1, wherein the guide groove portion is formed such that the plurality of grooves is formed around each side of the chip within a maximum formation ratio.

4. The power module of claim 1, wherein the guide groove portion is formed such that each of the plurality of grooves has a diameter equal to or less than a maximum diameter.

5. The power module of claim 1, wherein the power module comprises a plurality of chips including the chip, and as the guide groove portion has the plurality of grooves arranged as one row, an overlapping portion of the guide groove portion is formed as one row when each guide groove portion of respective chips of the plurality of chips overlaps since the respective chips different from each other are disposed adjacent to each other.

6. The power module of claim 1, wherein the upper substrate and the lower substrate are each formed of an upper metal layer, a lower metal layer, and an insulator that is interposed between the upper metal layer and the lower metal layer, and the guide groove portion is formed in the lower metal layer of the upper substrate and in the upper metal layer of the lower substrate as the chip is bonded to the lower metal layer of the upper substrate and to the upper metal layer of the lower substrate.

7. The power module of claim 6, wherein the guide groove portion is formed such that a depth of each of the plurality of grooves is less than a thickness of the upper metal layer or the lower metal layer to which the chip is bonded.

8. The power module of claim 1, wherein the guide groove portion has the plurality of grooves each of which is formed in a circular shape, so that the molten solder is filled in the guide groove portion during the soldering process.

9. The power module of claim 1, further comprising a spacer disposed to be spaced apart from the chip.

10. The power module of claim 9, wherein the spacer is further included in the upper substrate and the lower substrate.

11. The power module of claim 9, wherein the spacer is bonded to the upper substrate and the lower substrate by a soldering process.

12. The power module of claim 1, further comprising a lead frame disposed to be spaced apart from the chip.

13. The power module of claim 12, wherein the lead frame is electrically connected to any one of the upper substrate and the lower substrate.

14. The power module of claim 1, further comprising an upper cooling portion which is in contact with the upper substrate.

15. The power module of claim 1, further comprising a lower cooling portion which is in contact with the lower substrate.

16. A vehicle comprising the power module of claim 1.

* * * * *